(12) United States Patent
Nakata

(10) Patent No.: US 7,391,500 B2
(45) Date of Patent: Jun. 24, 2008

(54) LIGHT EXPOSURE APPARATUS AND METHOD OF LIGHT EXPOSURE USING IMMERSION LITHOGRAPHY WITH SATURATED CYCLIC HYDROCARBON LIQUID

(75) Inventor: Taisaku Nakata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 64 days.

(21) Appl. No.: 11/150,260

(22) Filed: Jun. 13, 2005

(65) Prior Publication Data

US 2005/0275817 A1 Dec. 15, 2005

(30) Foreign Application Priority Data

Jun. 15, 2004 (JP) .............................. 2004-176451

(51) Int. Cl.
*G03B 27/42* (2006.01)

(52) U.S. Cl. ...................................... 355/53

(58) Field of Classification Search ................... 355/30, 355/53; 359/665; 346/509
See application file for complete search history.

(56) References Cited

U.S. PATENT DOCUMENTS

| 4,000,181 | A  | * | 12/1976 | Elliott et al. ................. 514/531 |
| 6,291,566 | B1 | * | 9/2001  | Shin et al. .................... 524/390 |
| 2005/0202351 | A1 | * | 9/2005  | Houlihan et al. ............ 430/322 |
| 2005/0286031 | A1 |   | 12/2005 | French et al. |

FOREIGN PATENT DOCUMENTS

| JP | 7-220990 | 8/1995 |
| WO | WO 2005/119371 | 12/2005 |

OTHER PUBLICATIONS

U.S. Appl. No. 60/575,982, filed Jun. 2004, French et al.*

* cited by examiner

*Primary Examiner*—Diane I Lee
*Assistant Examiner*—Chia-how Michael Liu
(74) *Attorney, Agent, or Firm*—Young & Thompson

(57) ABSTRACT

In view of stably forming resist patterns with an excellent resolution, a light exposure apparatus 100 comprises a light source 101 irradiating a mask 102 with light, a projection optical system 103 projecting an image of the mask 102 onto a wafer 110, and a liquid supply unit 105 filling a liquid medium 109 between the projection optical system 103 and the wafer 110. A saturated cyclic hydrocarbon or its derivative is used as the liquid medium 109.

19 Claims, 2 Drawing Sheets

LIGHT EXPOSURE APPARATUS AND METHOD OF LIGHT EXPOSURE USING IMMERSION LITHOGRAPHY WITH SATURATED CYCLIC HYDROCARBON LIQUID

This application is based on Japanese patent application No. 2004-176451 the content of which is incorporated hereinto by reference.

BACKGROUND OF THE INVENTION

1. Field of the Invention

The present invention relates to a light exposure apparatus based on the liquid immersion process, and a method of light exposure.

2. Related Art

One of a known conventional method of light exposure based on the liquid immersion process is such the one described in Japanese Laid-open patent publication No. H07-220990. The Japanese Laid-open patent publication No. H07-220990 described a method of forming patterns using a liquid filled as a medium between a light exposure lens and a substrate. It is describes that use of a liquid having a specific refractive index of 1 or larger, such as water, makes it possible to improve resolution in resist patterning.

SUMMARY OF THE INVENTION

Investigation by the present inventors into the conventional liquid immersion exposure, however, revealed that there was still another room for improvement in terms of stable formation of resist patterns.

The present inventor went through extensive investigations aiming at stably improving patterning characteristics in the method of light exposure based on the liquid immersion process, and finally found that use of a liquid containing a saturated cyclic hydrocarbon or its derivative, as a medium allowing exposure light to pass therethrough, makes it possible to stably form fine resist patterns. The finding led us to the present invention.

According to the present invention, there is provided a light exposure apparatus comprising a light source irradiating a mask with light; a projection optical system projecting an image of the mask onto a substrate; and a liquid supply unit filling a liquid medium between the projection optical system and the substrate, the liquid medium containing a saturated cyclic hydrocarbon or its derivative.

According to the present invention, there is also provided a method of light exposure irradiating a mask with light and guiding the light through a liquid medium to the surface of a substrate, to thereby transfer a pattern of the mask onto the surface of the substrate, wherein the liquid medium contains a saturated cyclic hydrocarbon or its derivative.

In the present invention, the light is guided through a medium containing a saturated cyclic hydrocarbon or its derivative. This makes it possible to stably pattern a resist provided on the surface of a substrate with a high resolution, based on the liquid immersion exposure.

It is to be noted herein that the above-described liquid medium, containing a saturated cyclic hydrocarbon or its derivative, may contain also other components so far as the content thereof is not causative of local variation in refractive index of the liquid medium, and does not interfere stable patterning.

In the present invention, the saturated cyclic hydrocarbon may be any one of, or two or more of monocyclic compounds selected from the group consisting of cyclopropane, cyclobutane, cyclopentane, cyclohexane, cycloheptane, cyclooctane, cyclononane and cyclodecane. This allows more stable resist patterning based on the liquid immersion exposure.

In the present invention, the saturated cyclic hydrocarbon may have an alkyl substituent having the number of carbon atoms of 1 to 6. This makes it possible to increase refractive index of the liquid medium as compared with the case where a non-substituted compound is used, and to more stably carry out the resist patterning.

In the present invention, the liquid medium may have a refractive index of 1.5 or more to the light having a wavelength of 193 nm. This makes it possible to more exactly improve the resolution and depth of focus.

Any arbitrary combinations of these configurations, or any exchanges of expressions in the present invention among the method, apparatus and so forth are also effective as embodiments of the present invention.

The light exposure apparatus of the present invention may have a chamber in which a substrate is set, and the chamber may be supplied with the liquid medium. This makes it possible to more stably carry out the transfer of a mask pattern, and makes the configuration of the light exposure apparatus more excellent in the safety.

In the light exposure apparatus of the present invention, the liquid supply unit may comprise a degassing unit degassing the liquid medium. This makes it possible to more stably pattern the resist.

In the light exposure apparatus of the present invention, the liquid supply unit may comprise a purification unit purifying the liquid medium. This makes it possible to raise purity of the liquid medium, and to thereby more stably pattern the resist.

According to the present invention, there is also provided a liquid medium used for light exposure based on the liquid immersion process, and contains a saturated cyclic hydrocarbon or its derivative.

As has been described in the above, the present invention can realize a technique of stably forming resist patterns with a high resolution, by guiding light through a liquid medium mainly containing a saturated cyclic hydrocarbon or its derivative to the surface of the substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
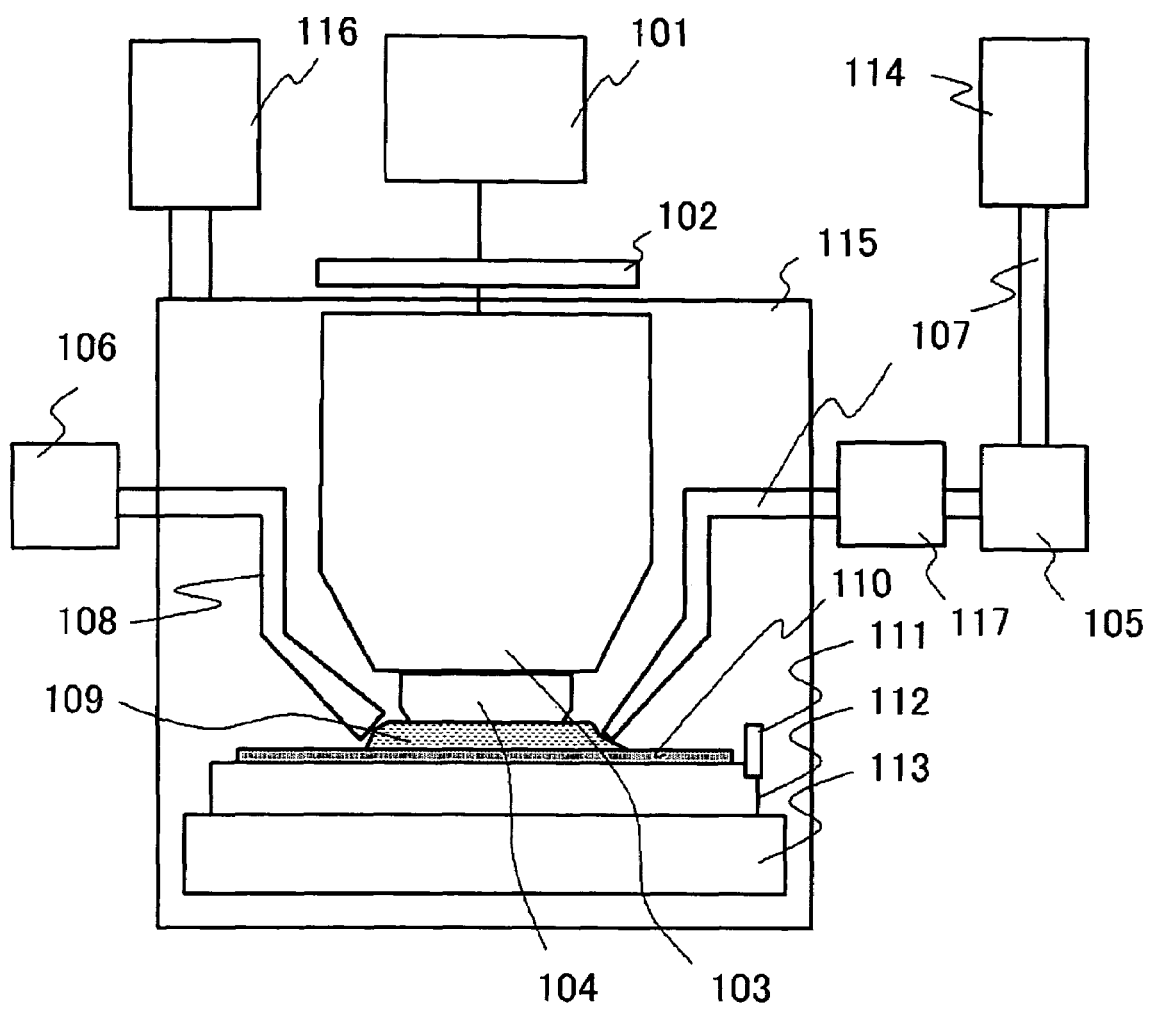
FIG. 1 is a schematic sectional view showing a configuration of a light exposure apparatus according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention, referring to the attached drawings. In all drawings, any common constituents will be given with the same reference numeral, and detailed explanations therefor may not be represented when appropriate.

FIG. 1 is a sectional view schematically showing a configuration of a light exposure apparatus according to this embodiment. A light exposure apparatus 100 shown in FIG. 1 comprises a light source 101 irradiating a mask 102 with light, a projection optical system 103 projecting an image of the mask 102 onto a wafer 110, and a liquid supply unit 105 filling a liquid medium between the projection optical system 103 and wafer 110.

More specifically, the light exposure apparatus 100 comprises the light source 101, the mask 102, the projection optical system 103, a projection lens 104, the liquid supply unit 105, a liquid recovery unit 106, a liquid supply piping 107, a liquid recovery piping 108, a liquid medium 109, the wafer 110, a mirror 111, a Z stage 112, an XY stage 113, a purification unit 114, a thermostatic chamber 115, an exhaust unit 116, and a degassing unit 117.

The thermostatic chamber 115 has a temperature regulation unit (not shown), and is configured so as to allow temperature control of the chamber. The exhaust unit 116 is typically configured by an evacuation pump, and is connected to the thermostatic chamber 115 so as to evacuate gas in the thermostatic chamber 115.

The thermostatic chamber 115 has the XY stage 113 disposed therein, and the XY stage 113 has the mirror 111 and Z stage 112 disposed thereon. The wafer 110 is placed on the Z stage 112. On the top surface of the wafer 110, a resist mask to be patterned by light exposure is disposed.

The liquid medium 109 is supplied between the projection lens 104, composing a part of the projection optical system 103, and the wafer 110, and serves as a transmission route for exposure light.

After light exposure, the liquid medium 109 is recovered through liquid recovery piping 108 into the liquid recovery unit 106 disposed outside the thermostatic chamber 115.

The liquid medium 109 is filled between the wafer 110 and the projection lens 104. The liquid medium 109 is supplied to the liquid supply unit 105 after being purified by the purification unit 114, and further from the liquid supply unit 105 to the degassing unit 117. The liquid degassed in the degassing unit 117 is then introduced through the liquid supply piping 107 into the thermostatic chamber 115, and supplied to the surface of the wafer 110.

The light source 101 irradiates the mask 102 with light of a predetermined wavelength. The light source 101 may typically be a laser source. Specific examples may include excimer laser sources such as ArF excimer laser source having a wavelength of 193 nm, KrF excimer laser source having a wavelength of 248 nm and $F_2$ excimer laser source having a wavelength of 157 nm. It is also allowable to dispose a lighting optical system such as lens, reflective mirror and so forth between the light source 101 and the mask 102.

The laser light passed through the mask 102 is guided through the projection optical system 103 and the projection lens 104 in this order to the liquid medium 109 as a medium. The light passed through the liquid medium 109 is irradiated on the surface of the wafer 110.

In thus-configured light exposure apparatus 100, the light exposure is carried out by irradiating light while keeping the liquid medium 109 containing a saturated cyclic hydrocarbon or its derivative as being filled between the wafer 110 and the projection lens 104. The liquid medium 109 has saturated ring-forming carbon atoms and is a cyclic compound having no π electrons, so that the medium has a refractive index larger than that of a straight-chain compound having the same atoms composing the ring. This is successful in increasing the depth of focus and resolution in the light exposure. It also contributes to increase in the exposure margin. The reasons why will be described below.

In the liquid immersion light exposure, resolution R is expressed as below, using numerical aperture $NA_{dry}$ in the air, and numerical aperture $NA_{wet}$ in a liquid having refractive index n:

$$R = k_1 \cdot 1/NA_{wet}$$
$$= k_1 \cdot 1/[n \cdot NA_{dry}]$$
$$= [1/n] \cdot k_1 \cdot 1/NA_{dry}$$

where, $k_1$ is a constant, and l is wavelength of the exposure light. Refractive index of the air is 1. Filling of a liquid having refractive index n between the wafer 110 and the projection lens 104, therefore, makes it possible to obtain an effect substantially equivalent to that obtained under wavelength of light adjusted to 1/n. This makes it possible to reduce the minimum resolution dimension as being multiplied by a factor of 1/n, and to improve the resolution.

The depth of focus DOF is expressed as:

$$DOF = k_2 \cdot 1/NA^2$$
$$= k_2 \cdot [1/n]/[NA/n]^2$$
$$= n \cdot k_2 \cdot 1/NA^2.$$

It is understood that, also with respect to DOF, an effect substantially equivalent to that obtained under wavelength of light adjusted to 1/n is obtained by using the liquid medium 109 having refractive index n. $k_2$ is a constant.

Use of a saturated cyclic hydrocarbon as the liquid medium 109 is successful in increasing the refractive index as compared with that of non-cyclic hydrocarbon having the same number of carbon atoms, as described later in Examples. This makes it possible to increase the depth of focus on the surface of the wafer 110. It is also successful in expanding the exposure margin. For example, the liquid medium 109 can be composed of a saturated cyclic hydrocarbon having a refractive index n of 1.5 at 193 nm.

Use of a saturated cyclic hydrocarbon as the liquid medium 109 is successful in making the medium less locally variable in the refractive index as compared with any straight-chain hydrocarbon having the same number of carbon atoms. This allows further stable pattern formation by light exposure.

The liquid medium 109 may be a liquid having substantially no reactivity with the light emitted from the light source 101. This allows further stable light exposure. This also makes it possible to exactly suppress deterioration of a resist film provided on the surface of the wafer 110. Use of a cyclic hydrocarbon, having saturated ring-forming carbon atoms, as the liquid medium 109 is successful in lowering the photoreactivity as compared with that of compounds having unsaturated carbon atoms, such as benzene.

The liquid medium 109 may be a liquid substantially transparent to the light emitted from the light source 101. This ensures exact light exposure. In an exemplary case using an ArF excimer laser source as the light source 101, the liquid medium 109 preferably has a transmissivity of 90% or above at a wavelength of 193 nm. In another exemplary case using a KrF excimer laser source as the light source 101, the liquid medium 109 preferably has a transmissivity of 90% or above at a wavelength of 248 nm. In still another exemplary case using a $F_2$ excimer laser source light source 101, the liquid medium 109 preferably has a transmissivity of 90% or above at a wavelength of 157 nm. Use of a cyclic hydrocarbon having saturated ring-forming carbon atoms as the liquid medium 109 is successful in increasing the transmissivity even for the exposure light having shorter wavelength, as compared with compounds having unsaturated carbon atoms in their rings, such as benzene ring.

The liquid medium 109 applicable herein generally has a liquid form at normal temperature (25° C.). The liquid medium 109 may be a liquid having a high boiling point. More specifically, the liquid medium 109 may have a boiling point of 50° C. or above, and more preferably 70° C. or above. This is successful in suppressing evaporation of the liquid medium 109 during the light exposure or operations. This allows stable patterning of resist based on the liquid immersion process. There is no special limitation on the upper limit of the boiling point of the liquid medium 109, allowing 300° C. or below, for example.

The liquid medium 109 may be configured as having a small solubilizing performance to the resist provided on the surface of the wafer 110. Those having large differences in the solubility parameter with respect to the resist material are applicable as the liquid medium 109. In an exemplary case where an acrylate-base resin is used as the resist material, the solubility parameter of the liquid medium 109 may be adjusted to 5 to 10, or 12 to 20, both ends inclusive. The solubility parameter adjusted to not larger than 10 or not smaller than 12 makes it possible to suppress solubilization of the resin material composing the resist. The solubility parameter adjusted to not smaller than 5 or not larger than 20 makes it possible to suppress solubilization of low-molecular-weight components contained the resist. As a consequence, it is made possible to exactly suppress degradation in the resist patterning characteristics, and to stably obtain fine resist patterns.

The liquid medium 109 is preferably a liquid having a small viscosity. This successfully prevents bubbles from being formed between the wafer 110 and the projection lens 104. This makes it possible to further stably pattern the resist.

It is also preferable to adjust polarity of the liquid medium 109 within an appropriate range. Too large polarity may result in strong interaction with resist constituents, and in heavier damage of the resist. Too small polarity, on the contrary, may result in enhanced solubilization property of the resist constituents.

The liquid medium 109 may typically contain cycloalkane or bicycloalkane or derivatives of these as the saturated cyclic hydrocarbon. Specific examples of the saturated cyclic hydrocarbon include monocyclic hydrocarbons having the number of ring-forming carbon atoms of 3 to 10 such as cyclopropane, cyclobutane, cyclopentane, cyclohexane, cycloheptane, cyclooctane, cyclononane and cyclodecane; and bicyclic hydrocarbons such as bicyclo[2,2,0]hexane and decaline. Use of these compounds makes it possible to more stably pattern the resist based on the liquid immersion light exposure.

The saturated cyclic hydrocarbon may be a compound having ring-forming carbon atoms, and an alkyl substituent group having the number of carbon atoms of 1 to 6. The alkyl group may be those typically expressed by —$C_nH_{2n+1}$ (n is an integer from 1 to 6). Specific examples thereof include straight-chain alkyl groups such as methyl group, ethyl group, n-propyl group, n-butyl group, n-pentyl group and n-hexyl group. The alkyl group may also be those having branched chains such as i-propyl group and t-butyl group.

Examples of the derivatives of the saturated cyclic compounds having the alkyl substituent having the number of carbon atoms of 1 to 6 typically include cyclic compounds typically having, as the side chain of the ring, groups such as —$C_nH_{2n}$OH (n is an integer from 1 to 6), —$C_nH_{2n}$CN (n is an integer from 1 to 6), —$C_nH_{2n}$X (n is an integer from 1 to 6, X is a halogen selected from F, Cl, Br and I), and —$C_nX_{2n+1}$ (X is a halogen selected from F, Cl, Br and I).

The saturated cyclic hydrocarbon may have a —F group, —Cl group, —Br group, or —CN group in a side chain of the ring.

Examples of the saturated cyclic hydrocarbon include cycloalkanes such as cyclopropane, cyclobutane, cyclopentane, cyclohexane, cycloheptane, cyclooctane, cyclononane, cyclodecane, and their derivatives;

compounds having an atomic group expressed by —CN as a side chain of the ring, such as cyclopropyl cyanide, cyclopentyl carbonitrile, cyclohexyl carbonitrile, cyclopropyl acetonitrile, and their derivatives;

compounds having a —Br, —Cl or —F atom in a side chain of the ring, such as cyclobutyl bromide, cyclopentyl bromide, cyclohexyl bromide, cyclobutyl chloride, cyclopentyl chloride, cyclohexyl chloride, perfluoromethyl cyclohexane, perfluorodecaline, and their derivatives;

compounds having alkyl alcohol as a side chain of the ring, such as cyclopropyl methanol, cyclobutane methanol, cyclopentane propanol, cyclohexyl methanol, 2-cyclohexyl ethanol, 4-cyclohexyl-1-butanol, and their derivatives; and compounds having an alkyl group as a side chain, such as methyl cyclohexane, methyl cyclopentane, and their derivatives. Use of these compounds makes it possible to stably carry out fine pattern formation based on the liquid immersion process.

In the saturated cyclic compound used as the liquid medium 109 in the present invention, the number of the substituent group in the side chain on one ring-forming carbon atom may be one or two or more. Of the ring-forming carbon atoms, the number of those having the substituent group in the side chain thereof is not specifically limited.

The liquid medium 109 may be composed of a single compound of the present invention, or may contain a plurality of compounds according to the present invention. The liquid medium 109 may be configured also as being composed of a saturated cyclic compound. The medium may contain compound other than those specified by the present invention, provided that the medium mainly comprises the compound according to the present invention. It is to be noted herein that "mainly comprises" means that other components may be contained up to an amount not causative of local variation in the refractive index of the liquid, and of destabilization of the patterning. For example, the medium may be a liquid containing a saturated cyclic hydrocarbon or its derivative to as much as 98%.

By configuring the liquid medium 109 as being composed of a single compound according to the present invention, it is made possible to suppress local variation in the refractive index of the liquid medium 109. This consequently makes it possible to further stably form the resist pattern over the entire surface of the wafer 110.

A method of light exposure using the light exposure apparatus 100 shown in FIG. 1 will be explained. First, the wafer 110 is set in the exhaust unit 116, and aligned by adjusting the Z stage 112 and the XY stage 113. The exhaust unit 116 and temperature regulator (not shown) are also adjusted so as to condition the thermostatic chamber 115 to a predetermined temperature and to a predetermined pressure.

The liquid medium 109 which has passed through the degassing unit 117 is then filled between the projection lens 104 and the wafer 110, through the liquid supply piping 107 using the liquid supply unit 105. The light from the light source 101 is irradiated on the mask 102, and is guided through the liquid medium 109 to the surface of the wafer 110. The light exposure is thus taken place through transfer of a pattern of the mask 102 onto the surface of the wafer 110.

It is also allowable herein that the liquid medium 109 may be supplied to the liquid supply unit 105 after being preliminarily distilled by the purification unit 114. This makes it possible to raise purity of the liquid medium 109, and thereby to suppress variation in the refractive index.

Next paragraphs will describe effects of the light exposure apparatus 100 shown in FIG. 1.

The light exposure apparatus 100 is configured so as to effect light exposure while keeping the liquid medium 109 filled between the surface of the wafer 110 and the projection lens 104. This successfully increases refractive index of the light path, and enables stable patterning. Resolution and depth of focus in the drawing thus can be improved. This also expands the exposure margin. It is thus made possible to stably fabricate fine resist patterns with a high yield.

The light exposure apparatus 100 has the degassing unit 117. This makes it possible to supply the liquid medium 109 preliminarily degassed between the wafer 110 and the projection lens 104. This is successful in suppressing generation of bubbles between the wafer 110 and the projection lens 104. It is therefore made possible to stably carry out the resist patterning.

The light exposure apparatus 100 has the purification unit 114. This makes it possible to remove impurities in the liquid medium 109, and to improve the purity. This is therefore successful in suppressing distribution in the refractive index of the liquid medium 109.

The light exposure apparatus 100 is also configured so that the wafer 110 is set in the thermostatic chamber 115. This makes it possible to suppress temperature change of the surface of the wafer 110 during the light exposure. This is successful in exactly suppressing the patterning characteristics. This also successfully suppresses evaporation of the liquid medium 109 under heating. Fine patterns can therefore be fabricated in a stable manner.

Although the foregoing paragraphs have described the embodiments of the present invention referring to the attached drawings, these are merely examples of the present invention, allowing various configurations other than those described in the above.

For example, it is also allowable to appropriately form a protective film on the surface of the resist film provided on the wafer 110. This is successful in more stably suppressing elution of the resist components into the liquid medium 109, even when the light exposure is effected under contact with the liquid medium 109 mainly containing a saturated cyclic hydrocarbon or its derivative. This consequently makes it possible to more stably form the resist pattern. Materials for composing the protective film can appropriately be selected depending on species of the resist.

EXAMPLES

In this Example, resist was patterned using the light exposure apparatus 100 configured as shown in FIG. 1. The light source used herein was an ArF excimer laser source having a wavelength of 193 nm. The wafer 110 used herein was a silicon wafer having an antireflection layer formed on the resist coated surface thereof. A resist film of 0.4 μm thick was formed on the surface of the wafer, using an acrylate-base positive resist composition. A resin contained in the resist composition was such as having a solubilization parameter of 11.0. A pattern was transferred while varying species of the liquid filled between the surface of the resist film and the projection lens, and patterning characteristics were evaluated for every liquid.

The liquid media 109 used herein were pure water, n-hexane, chlorobenzene, cyclopentane, cyclohexane, methyl cyclohexane, cyclohexyl methanol, cyclohexyl chloride, cyclohexyl carbonitrile, cyclodecane, perfluoromethyl hexane, and perfluorodecaline.

The patterning characteristics were evaluated by forming a line pattern of 0.1 μm width on ten wafers for the respective cases using the individual liquids, and by observing the pattern under a SEM (scanning electron microscope). Results are shown in Table 1.

TABLE 1

| | STABILITY IN PATTERN FORMATION | SOLUBILITY OF RESIST | REFRACTIVE INDEX (nD)*1 | TRANSPARENCY AT 193 nm | SOLUBILITY PARAMETER $((cal/cm^3)^{1/2})$ | BOILING POINT (° C.) |
|---|---|---|---|---|---|---|
| PURE WATER | x | NOT CHANGED | 1.333 | ○ | 23.53 | 100 |
| n-HEXANE | Δ | NOT CHANGED | 1.375 | Δ | 7.27 | 68.7 |
| CYCLOPENTANE | ○ | NOT CHANGED | 1.400 | Δ | 8.7 | 50 |
| CYCLOHEXANE | ○ | NOT CHANGED | 1.426 | Δ | 8.2 | 80.7 |
| METHYLCYCLOHEXANE | ○ | NOT CHANGED | 1.422 | Δ | 7.8 | 100 |
| CYCLOHEXYL METHANOL | Δ~○ | NOT CHANGED | 1.465 | Δ | NO DATA | 181 |
| CYCLOHEXYL CHLORIDE | ○ | NOT CHANGED | 1.462 | Δ | 8.99 | 142 |
| CYCLOHEXYL CARBONITRILE | Δ~○ | NOT CHANGED | 1.4505 | Δ | NO DATA | 75*2 |
| CYCLODECANE | ○ | NOT CHANGED | 1.471 | Δ | NO DATA | 201 |
| PERFLUOROMETHYL CYCLOHEXANE | ○ | NOT CHANGED | 1.300 | Δ | 6.0 | 76 |

TABLE 1-continued

| | STABILITY IN PATTERN FORMATION | SOLUBILITY OF RESIST | REFRACTIVE INDEX (nD)[*1] | TRANSPARENCY AT 193 nm | SOLUBILITY PARAMETER ((cal/cm$^3$)$^{1/2}$) | BOILING POINT (° C.) |
|---|---|---|---|---|---|---|
| PERFLUORODECALINE | ○ | NOT CHANGED | 1.317 | Δ | NO DATA | 142 |
| CHLOROBENZENE | x | CHANGED AT THE SURFACE | 1.524 | x | 9.5 | 132 |

[*1]REFLACTIVE INDEX FOR SODIUM D LINE (589 nm)
[*2]16 mm Hg

Stability shown in Table 1 is classified as follows:
○—twice or less times of failure in pattern formation;
Δ—three to five times of failure in pattern formation; and
X—six times or more failure in pattern formation, which were confirmed by visual inspection of whether the pattern was stably formed or not over 10 times of patterning.

Solubilization property of the resist was confirmed by dropping the individual liquid onto the surface of the resist film, allowing it to dry, and visually observing the surface state after drying. The solubilization property was judged as small if no change was observed in the surface condition from that observed before the liquid drop, and judged as large if any change was observed in the surface appearance.

As shown in Table 1, use of cyclopentane, cyclohexane and methyl cyclohexane was particularly successful in stable pattern formation. Under the same numerical aperture NA, the depth of focus DOF observed when cyclohexane was used was found to reach 1.1 times of that observed when water was used.

Reasons for the improvement in the geometrical stability of the resist through the use of cycloalkanes are supposed as follows, although being not fully clarified.

In the light exposure based on the liquid immersion process, it is desired to suppress fluctuation in the refractive index in the internal of the liquid medium 109 filled between the projection lens 104 and the wafer 110. Use of cycloalkanes is successful in suppressing the fluctuation, by virtue of relatively small interaction between the liquid medium 109 and the resist surface.

n-Hexane is a straight-chain compound, and can have various configurations in the liquid medium 109, so that it is supposed to cause relatively large fluctuations in the refractive index, and to result in local distribution of the refractive index. In contrast to this, cycloalkanes causative of only a relatively small fluctuation in the refractive index can suppress generation of the local distribution in the refractive index, allowing stable resist patterning.

Figure 2:
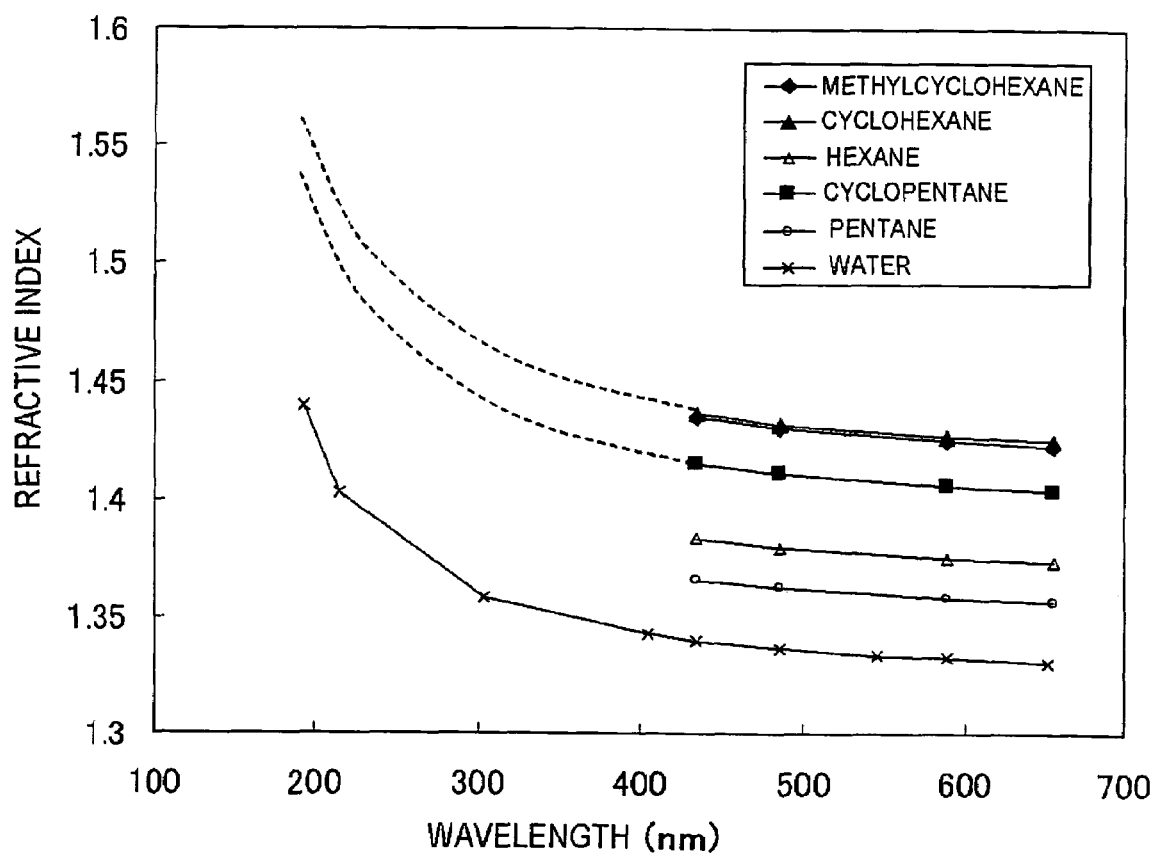
FIG. 2 is a drawing showing relations between wavelength of light and refractive index of liquid.

Refractive indices of these liquid are shown in FIG. 2. It is known from FIG. 2 that, as compared among alkanes having the same number of carbon atoms, the cyclic compounds show larger refractive indices than those shown by the straight-chain compounds, and those having a larger number of carbon atoms in the main chain show larger refractive indices. From these findings, it was supposed that the resolution and depth of focus were improved and the patterning was stabilized when cyclopentane, cyclohexane, and methyl cyclohexane derived therefrom were used, as compared with the case where n-hexane was used.

It was also supposed that cycloalkanes have only a low solubilization property to photo-acid generator or basic additives contained in the resist material, and consequently have sufficient levels of transparency at a wavelength of 193 nm, and that this resulted in more desirable patterning characteristics as compared with those obtained with use of pure water or chlorobenzene, without providing any protective film on the surface of the resist material.

It was still also supposed that cycloalkanes have polarities smaller than that of pure water, and this successfully suppressed variation in the refractive index ascribable to interaction with the resist components, and consequently allowed stable patterning.

It is apparent that the present invention is not limited to the above embodiments, that may be modified and changed without departing from the scope and spirit of the invention.

What is claimed is:

1. A light exposure apparatus comprising:
a light source irradiating a mask with light;
a projection optical system projecting an image of said mask onto a substrate; and
a liquid supply unit filling a liquid medium between said projection optical system and said substrate,
wherein,
said liquid medium mainly comprises at least one saturated monocyclic compound selected from the group consisting of cyclopropane, cyclobutane, and derivatives thereof.

2. The light exposure apparatus according to claim 1, wherein said liquid medium has a refractive index of 1.5 or more to said light having a wavelength of 193 nm.

3. The light exposure apparatus according to claim 1, further comprising a chamber in which a substrate is set, and said chamber is supplied with said liquid medium.

4. The light exposure apparatus according to claim 1, wherein said liquid supply unit comprises a degassing unit degassing said liquid medium.

5. The light exposure apparatus according to claim 1, wherein said liquid supply unit comprises a purification unit purifying said liquid medium.

6. A light exposure apparatus comprising:
a light source irradiating a mask with light;
a projection optical system projecting an image of said mask onto a substrate; and
a liquid supply unit filling a liquid medium between said projection optical system and said substrate,
said liquid medium containing a saturated cyclic hydrocarbon or a derivative thereof, said saturated hydrocarbon and said derivative thereof having an alkyl substituent having the number of carbon atoms of 1 to 6.

7. The light exposure apparatus according to claim 6, wherein said liquid medium has a refractive index of 1.5 or more to said light having a wavelength of 193 nm.

8. The light exposure apparatus according to claim 6, further comprising a chamber in which a substrate is set, and said chamber is supplied with said liquid medium.

9. The light exposure apparatus according to claim 6, wherein said liquid supply unit comprises a degassing unit degassing said liquid medium.

10. The light exposure apparatus according to claim 6, wherein said liquid supply unit comprises a purification unit purifying said liquid medium.

11. The light exposure apparatus according to claim 6, wherein,
said alkyl substituent is a side chain selected from the group consisting of $C_nH_{2n}OH$, $C_nH_{2n}CN$, $C_nH_{2n}X$, $C_nX_{2n+1}$,
n is an integer from 1 to 6, and
X is selected from the group consisting of F, Cl, Br, and I.

12. A method of light exposure, comprising:
irradiating a mask with light and guiding said light through a liquid medium to the surface of a substrate, to thereby transfer a pattern of said mask onto the surface of said substrate, wherein,
said liquid medium mainly comprises at least one saturated monocyclic compound selected from the group consisting of cyclopropane, cyclobutane, and derivatives thereof.

13. The method of light exposure according to claim 12, wherein said liquid medium has a refractive index of 1.5 or more to said light having a wavelength of 193 nm.

14. A method of light exposure, comprising:
irradiating a mask with light and guiding said light through a liquid medium to the surface of a substrate, to thereby transfer a pattern of said mask onto the surface of said substrate,
wherein said liquid medium contains a saturated cyclic hydrocarbon or a derivative thereof, said saturated cyclic hydrocarbon and said derivative thereof having an alkyl substituent having the number of carbon atoms of 1 to 6.

15. The method of light exposure according to claim 14, wherein said liquid medium has a refractive index of 1.5 or more to said light having a wavelength of 193 nm.

16. The method of light exposure according to claim 14, wherein,
said alkyl substituent is a side chain selected from the group consisting of $C_nH_{2n}OH$, $C_nH_{2n}CN$, $C_nH_{2n}X$, $C_nX_{2n+1}$,
n is an integer from 1 to 6, and
X is selected from the group consisting of F, Cl, Br, and I.

17. A liquid medium used for light exposure based on a liquid immersion process, mainly comprising:
at least one saturated monocyclic compound selected from the group consisting of cyclopropane, cyclobutane, and derivatives thereof; and
said at least one saturated monocyclic compound being fluidly connected to a light exposure apparatus for light exposure based on a liquid immersion process.

18. A liquid medium used for light exposure based on a liquid immersion process, comprising:
a saturated cyclic hydrocarbon or a derivative thereof, said saturated cyclic hydrocarbon and said derivative thereof having an alkyl substituent having the number of carbons of 1 to 6; and said at least one saturated monocyclic compound being fluidly connected to a light exposure apparatus for light exposure based on a liquid immersion process.

19. The liquid medium according to claim 18, wherein,
said alkyl substituent is a side chain selected from the group consisting of $C_nH_{2n}OH$, $C_nH_{2n}CN$, $C_nH_{2n}X$, $C_nX_{2n+1}$,
n is an integer from 1 to 6, and
X is selected from the group consisting of F, Cl, Br, and I.

* * * * *